(12) United States Patent
Kobayashi (10) Patent No.: US 6,593,821 B2
(45) Date of Patent: Jul. 15, 2003

(54) FREQUENCY CONTROLLED OSCILLATOR (75) Inventor: Bun Kobayashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/888,619

(22) Filed: Jun. 26, 2001

(65) Prior Publication Data
US 2002/0021180 A1 Feb. 21, 2002

(30) Foreign Application Priority Data
Jun. 29, 2000 (JP) .......................................... 2000-196640

(51) Int. Cl.[7] .................................................. H03B 1/00

(52) U.S. Cl. ............................... 331/74; 331/10; 331/17; 331/25; 331/34; 331/74; 331/107 SL; 331/107 DP; 327/105; 327/232; 327/233; 327/234; 327/235; 327/236

(58) Field of Search ........................... 331/74, 107 SL, 331/107 DP, 10, 17, 25, 34; 327/105, 232, 233, 234, 235, 236

(56) References Cited

U.S. PATENT DOCUMENTS

| 4,009,448 | A | * | 2/1977 | Hopwood et al. ............. 331/12 |
| 4,072,909 | A | * | 2/1978 | Citta ............................ 331/12 |
| 4,547,902 | A | * | 10/1985 | Kasperkovitz ............ 455/194.2 |
| 4,792,768 | A | * | 12/1988 | Fried et al. ..................... 331/11 |
| 5,451,910 | A | * | 9/1995 | Guthrie ......................... 331/16 |
| 5,661,424 | A | * | 8/1997 | Tang ........................... 327/105 |
| 5,847,620 | A | * | 12/1998 | Wong et al. ............. 331/117 D |
| 6,377,134 | B1 | * | 4/2002 | Takenaka ..................... 333/161 |

FOREIGN PATENT DOCUMENTS

JP   7-38433   2/1995

* cited by examiner

Primary Examiner—Michael Tokar
Assistant Examiner—Nguyen Khai
(74) Attorney, Agent, or Firm—Volentine Francos, PLLC (57) ABSTRACT An oscillator generates an oscillation signal, and a phase shifter outputs a phase shift oscillation signal corresponding to a difference between a frequency of the oscillation signal and a target frequency. A multiplier outputs a multiplied signal corresponding to a multiplied value of the phase shift signal and the oscillation signal, and an error signal generator outputs an error signal according to the multiplied signal. The output frequency of the oscillator is controlled according to the error signal.

20 Claims, 6 Drawing Sheets

FREQUENCY CONTROLLED OSCILLATOR

The present application claims priority under 35 U.S.C. φ119 to Japanese Application No.2000-196640 filed on Jun. 29, 2000, which is incorporated herein by reference in its entirely for all purposes.

BACKGROUND OF THE INVENTION

1. Field of the Invention

The present invention relates to a frequency controlled oscillator.

2. Description of the Related Art

A frequency control oscillator is used generate a signal of a fixed frequency in communication equipment. It is desirable that the signal output from the frequency control oscillator has a constant frequency even if temperature varies. A conventional frequency control oscillator is disclosed in Japanese laid open number HEI 7-38433.

Figure 1:
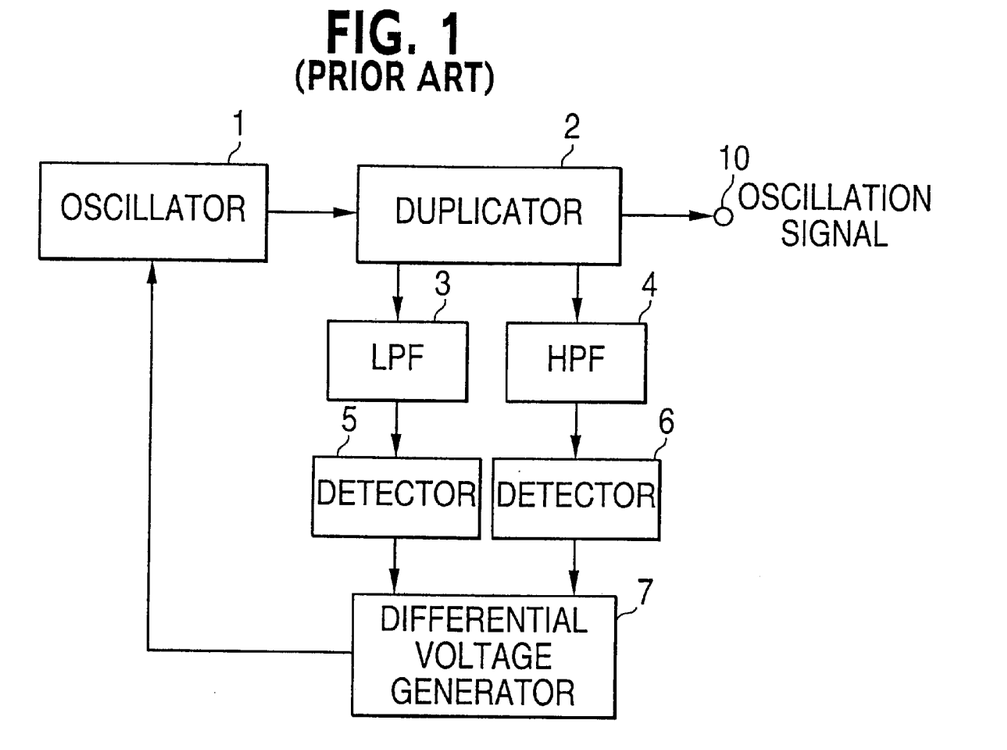
FIG. 1 is a schematic diagram of the frequency control oscillator of a conventional frequency control oscillator.

FIG. 1 is a schematic diagram of the frequency control oscillator disclosed above-mentioned reference. The frequency control oscillator has a voltage controlled oscillator 1, a duplicator 2, a low pass filter 3, a high pass filter 4, detectors 5 and 6, a differential voltage output circuit 7 and an output terminal 10.

The duplicator 2 produces three signals which are duplicates of an output signal from the voltage oscillator 1, which has a fixed frequency (for example 30 GHz), and outputs the three signals to the low pass filter 3, the high pass filter 4 and the output terminal 10, respectively. The low pass filter 3 selects a frequency component under 30 GHz, and outputs the same to the detector 5. The detector 5 detects an envelope of a low frequency component, and outputs a corresponding low frequency component signal to the differential voltage output circuit 7. The high pass filter 4 selects a frequency component over 30 GHz, and outputs the same to the detector 6. The detector 6 detects an envelope of a high frequency component, and outputs a corresponding high frequency component signal to the differential voltage output circuit 7. The differential voltage output circuit 7 calculates a difference between the low frequency component signal and the high frequency component signal, and outputs an error signal corresponding to the difference to the voltage control oscillator 1. The voltage control oscillator 1 controls an output frequency according to the error signal.

The operation of the conventional frequency control oscillator is described below. If the frequency of the output signal from the voltage control oscillator 1 is the target frequency (for example 30 GHz), then the low frequency component signal and the high frequency component signal are the same. The differential voltage output circuit 7 therefore outputs an error signal corresponding to "0"V, and the frequency of the output signal generated by the voltage control oscillator 1 is not changed. If the frequency of the output signal from the voltage control oscillator 1 is higher than the target frequency, a voltage of the high frequency component signal is higher than a voltage of the low frequency component signal. The differential voltage output circuit 7 therefore outputs an error signal corresponding to the difference, and the frequency of the output signal generated by the voltage control oscillator 1 is decreased according to the error signal. If the frequency of the output signal from the voltage control oscillator 1 is lower than the target frequency, the voltage of the low frequency component signal is higher than the voltage of the high frequency component signal. The differential voltage output circuit 7 therefore outputs an error signal corresponding to the difference, and the frequency of the output signal generated by the voltage control oscillator 1 is increased according to the error signal.

As described above, the high pass filter 4 and the low pass filter 3 are used to detect the difference between the output frequency and the target frequency, and the output frequency is controlled according to the detected difference.

However, the high pass filter 4 and low pass filter 3 must have precise operating characteristics in order to detect a slight difference between the frequency of the output signal and the target frequency. Therefore, the filters have a large area and multiple components, which makes downsizing difficult.

SUMMARY OF THE INVENTION

A frequency control oscillator includes an oscillator which generates an oscillation signal, and a frequency of the oscillation signal control led according to an error signal, a phase shifter which outputs a phase shift oscillation signal corresponding to a difference between the frequency of the oscillation signal and a target frequency, a multiplier which outputs a multiplied signal corresponding to a multiplied value of the phase shift signal and the oscillation signal and an error signal generator which outputs the error signal according to the multiplied signal.

BRIEF DESCRIPTION OF THE DRAWINGS

While the specification concludes with claims particularly pointing out and distinctly claiming the subject matter that is regarded as the invent ion, the invention, along with the objects, features, and advantages thereof, will be better understood from the following description taken in connection with the accompanying drawings in which:

DETAILED DESCRIPTION OF THE PREFERRED EMBODIMENT

Figure 2:
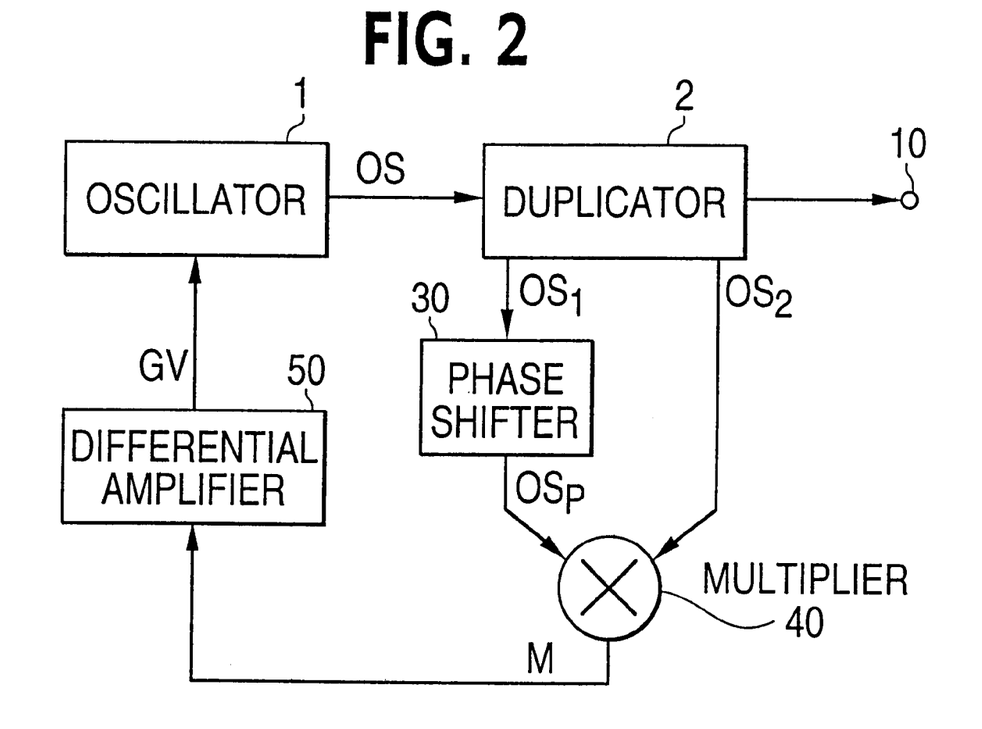
FIG. 2 is a schematic diagram of a frequency control oscillator of the preferred embodiment of the present invention.

FIG. 2 is a schematic diagram of a frequency control oscillator of a preferred embodiment. The frequency control oscillator has a voltage control oscillator 1, a duplicator 2, a phase shifter 30, a multiplier 40, an error signal generator 50 and an output terminal 10. The frequency control oscillator of the preferred embodiment stably outputs a signal having a target frequency ω.

The voltage control oscillator 1 generates an oscillation signal OS, which has a frequency corresponding to the target frequency ω (for example 30 GHz), and outputs the oscillation signal OS to the duplicator 2. The frequency of the oscillation signal OS is controlled by an error signal GV output from the error signal generator 50.

The duplicator 2 generates three signals OS1–OS3 which are duplicates of the oscillation signal OS, and outputs the signals OS1–OS3 to the phase shifter 30, the multiplier 40 and the output terminal 10, respectively.

The phase shifter 30 effectively conducts two phase shifts of the oscillation signal OS1. That is, the phase of the oscillation signal OS1 is first shifted by a fixed degree (fixed phase, for example 90 degrees). The phase of the oscillation signal OS1 is then further shifted according to the difference between the frequency of the oscillation signal OS1 and the target frequency ω. The thus shifted oscillation signal OS1 is output to the multiplier 40 as a phase shift oscillation signal OSP.

Figure 3:
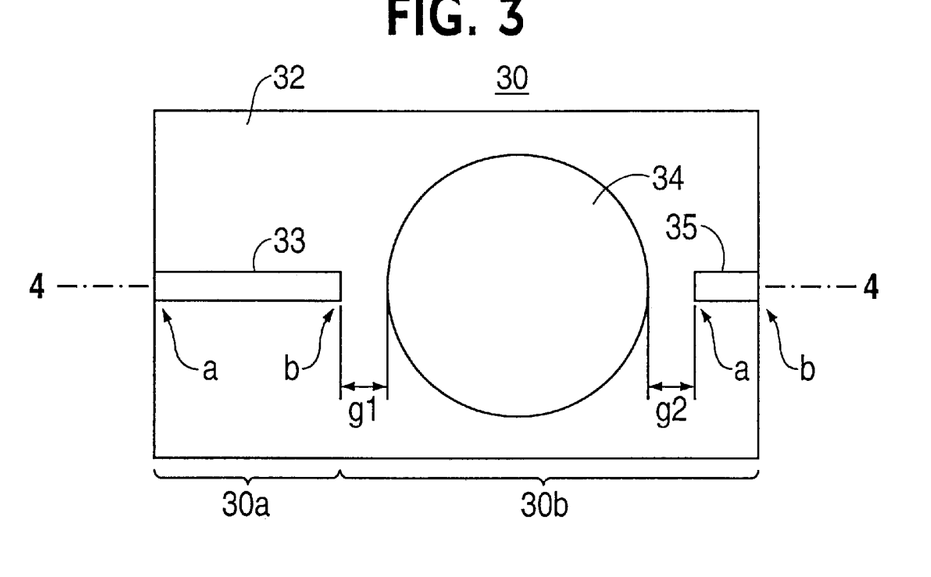
FIG. 3 shows a top view of a phase shifter of a preferred embodiment of the present invention.
Figure 4:
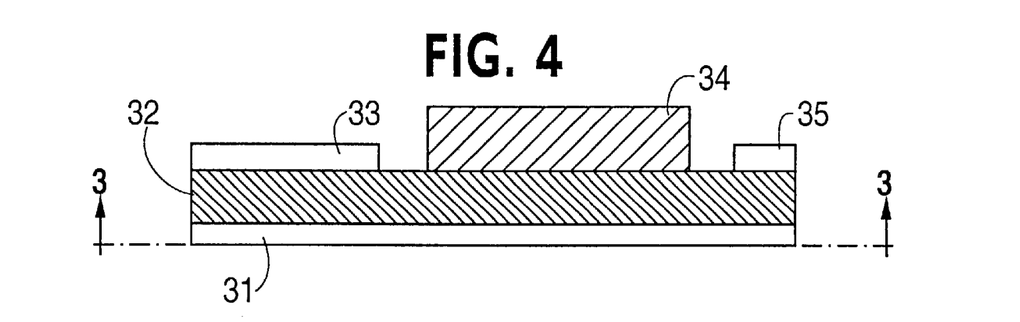
FIG. 4 shows a cross sectional view of the phase shifter shown in FIG. 3.

A structure and a shift operation of the phase shifter 30 are described below with reference to FIG. 3, FIG. 4, FIGS. 5(a) and 5(b). FIG. 3 shows a top view of the phase shifter 30 of the first preferred embodiment. FIG. 4 shows a cross sectional view of the phase shifter 30 shown in FIG. 3.

The phase shifter 30 includes a ground plate 31, a dielectric substrate 32, a first transmission line 33, a dielectric disc 34 and a second transmission line 35. The dielectric disc 34 of the present embodiment has a circular shape. The first and second transmission lines 33 and 35 have a structure called a micro strip line structure in the preferred embodiment. The micro strip line structure is a structure in which a dielectric substrate is disposed between two conductive layers. One conductive layer is connected to ground, and another conductive layer is used as a transmission line. Here, the ground plate 31 is connected to ground, and the first and second transmission lines 33 and 34 are used as a transmission line in the preferred embodiment.

The dielectric substrate 32 is formed over the ground plate 31. The first transmission line 33, the dielectric disc 34 and the second transmission line 35 are formed over the dielectric substrate 32. The dielectric disc 34 is disposed between the first transmission line 33 and the second transmission line 35. The first transmission line 33 substantially extends from a first edge of the dielectric substrate 32 toward the dielectric disc 34. The second transmission line 35 substantially extends from a second edge of the dielectric substrate 32 toward the dielectric disc 34. There is a distance g1 between an end of the first transmission line 33 and the dielectric disc 34 as shown in FIG. 3. There also is a distance g2 between an end of the second transmission line 35 and the dielectric disc 34 as shown in FIG. 3.

The first transmission line 33 has a length corresponding to ¼ of a wave length λ, which is the wave length of the target frequency ω. The oscillation signal OS1 output from the duplicator 2 is applied to the first transmission line 33 at the first edge of the dielectric substrate 32. The diameter and height of the dielectric disc 34 are determined according to a resonance mode, a resonance frequency and a dielectric constant. The resonance frequency is the same as the target frequency ω (for example 30 GHz). The diameter of the dielectric disc 34 can be minimized to about 1 mm when the phase shifter 30 of the preferred embodiment is applied to a device which handles a high frequency signal such as a millimeter wave. The phase shift oscillation signal OSP is output from the second transmission line 35 at the second edge of the dielectric substrate 32.

As described above, the phase shifter 30 effectively shifts the phase of the oscillation signal OS1 twice. Therefore, hypothetically there are two phase shifters. A first phase shifter 30a (transmission line phase shifter) corresponds to the first transmission line 33 as shown in FIG. 3. A second phase shifter 30b (dielectric phase shifter) corresponds to the distances g1, g2, dielectric disc 34 and the second transmission line 35 as shown in FIG. 3.

The oscillation signal OS1 is first applied to the transmission line phase shifter 30a. The transmission line phase shifter 30a shifts a phase of the oscillation signal OS1 according to the length of the first transmission line 33, and carries out an intermediate phase shift oscillation signal. In the preferred embodiment, the length of the first transmission line 33 is ¼ of the wave length λ of the target frequency ω. Therefore, the phase of the oscillation signal OS1 is delayed 90 degrees at the end of the first transmission line 33. This signal, which is delayed 90 degrees from the oscillation signal OS1, corresponds to the intermediate phase shift oscillation signal. The intermediate phase shift oscillation signal is output to the dielectric phase shifter 30b.

Figure 5A:
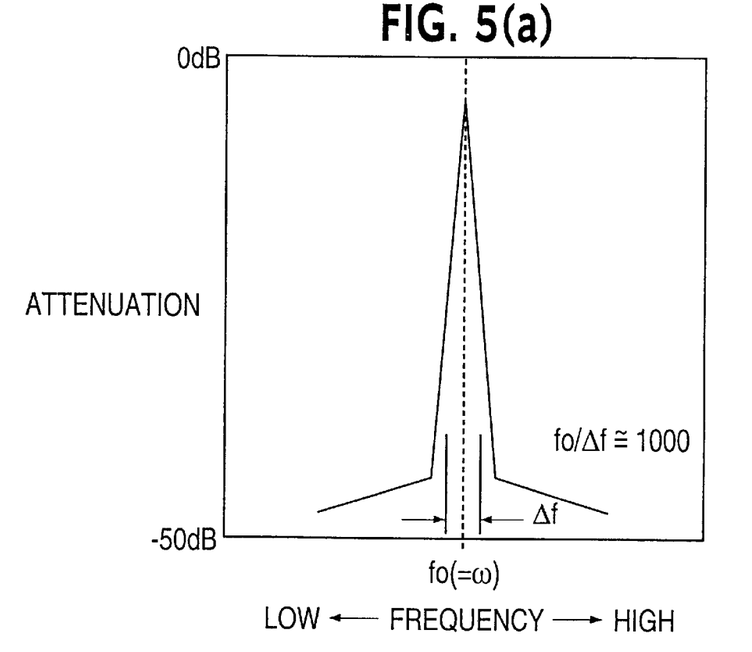
FIG. 5(a) shows a relationship between a frequency and an attenuation of a dielectric phase shifter of the present invention.
Figure 5B:
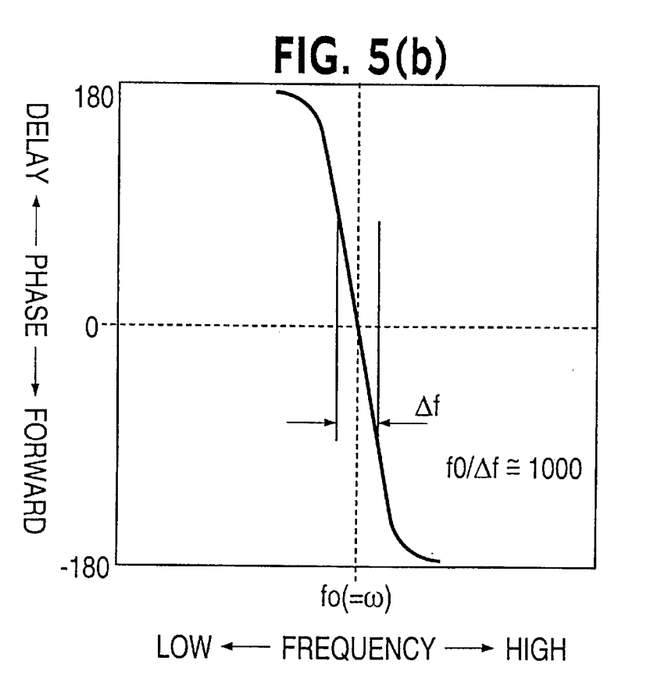
FIG. 5(b) shows a relationship between a frequency and a phase of the dielectric phase shifter.

FIG. 5(a) shows a relationship between a frequency and an attenuation of the dielectric phase shifter 30b. FIG. 5(b) shows a relationship between a frequency and a phase of the dielectric phase shifter 30b. The dielectric disc 34 resonates according to an applied signal, which is the intermediate phase shift oscillation signal in the preferred embodiment. The second transmission line 35 is formed to output the phase shift signal OSP. The length of the second transmission line is not limited in the preferred embodiment. However, in the case where the dielectric disc has a resonance frequency that is exactly the same as the target frequency ω, it is preferable that the length of the second transmission line 35 does not change the phase of the phase shift oscillation signal, which is output from the dielectric disc 34.

The dielectric phase shifter 30b has a fine quality factor as shown in FIG. 5(a). That is to say, the attenuation except for the resonate frequency is quite high. Therefore, the phase characteristics against the frequency are quite sharp around the resonate frequency f0, which is the target frequency ω, as shown in FIG. 5(b). When the intermediate phase shift oscillation signal is applied to the dielectric phase shifter 30b, a sensitive phase shift is performed on the intermediate phase shift oscillation signal.

For example, if the frequency of the oscillation signal OS1 is the same as the target frequency ω, the phase of the intermediate phase shift signal is not shifted by the dielectric phase shifter as shown in FIG. 5(b). Therefore, the intermediate phase shift signal, which is shifted 90 degrees from the oscillation signal OS1, is output as the phase shift oscillation signal OSP.

If the frequency of the oscillation signal OS is higher than the target frequency ω, the phase of the intermediate phase shift signal is further shifted forward by the dielectric phase shifter as shown in FIG. 5(b). The intermediate phase shift oscillation signal is shifted forward according to the difference between the frequency of the oscillation signal OS1 and the target frequency ω The signal shifted by the dielectric phase shifter 30b is output as the phase shift oscillation signal OSP. For example, in the case of a shifted phase, which corresponds to the difference of the frequencies of 10 degrees, the transmission line phase shifter 30a shifts forward the oscillation signal by 90 degrees, and the dielectric phase shifter 30b further shifts forward the intermediate phase shift signal by 10 degrees. As a result, 100 degrees of phase shift is performed in the phase shifter 30.

If the frequency of the oscillation signal OS is lower than the target frequency ω, the phase of the intermediate phase shift signal is delayed by the dielectric phase shifter as shown in FIG. 5(b). The phase of the intermediate phase shift oscillation signal is delayed according to the difference between the frequency of the oscillation signal OS1 and the target frequency ω. The signal shifted by the dielectric phase shifter 30b is output as the phase shift oscillation signal OSP. For example, in the case where a shifted phase, which corresponds to the difference of the frequencies, is 10 degrees, the transmission line phase shifter 30a shifts forward the oscillation signal for 90 degrees, and the dielectric phase shifter 30b delays the intermediate phase shift signal for 10 degrees. As a result, 80 degrees of phase shift is performed in the phase shifter 30.

For example, the voltage control oscillator 1 generates the oscillation signal OS of a sine wave, the phase shift oscillation signal OSP is expressed by a following equation:

$$OSP = a1 \cdot SIN\,[(\omega+\Delta\omega)t+(\pi/2)+k\cdot\Delta\omega]$$

where a1 is an amplitude, ω is the target frequency, Δω is a difference from the target frequency, and k is a phase deflection coefficient.

The phase shift oscillation signal OSP, which is shifted as described above, is output to the multiplier 40.

The multiplier 40 multiplies the phase shift oscillation signal OSP and the oscillation signal OS2, which is output from the duplicator 2. The oscillation signal OS2 is expressed by the following equation:

$$OS2 = a2 \cdot SIN(\omega+\Delta\omega)t$$

where a2 is an amplitude, ω is the target frequency, and Δω is a difference from the target frequency.

As a result of this calculation, a multiplied signal M is output to the error signal generating circuit 50. The multiplied signal M is expressed by the following equation:

$$M = (\tfrac{1}{2}) \cdot a1 \cdot a2 \cdot \{SIN\,[2(\omega+\Delta\omega)t+(\pi/2)+k\cdot\Delta\omega] - SIN(k\cdot\Delta\omega)\}$$

Figure 6:
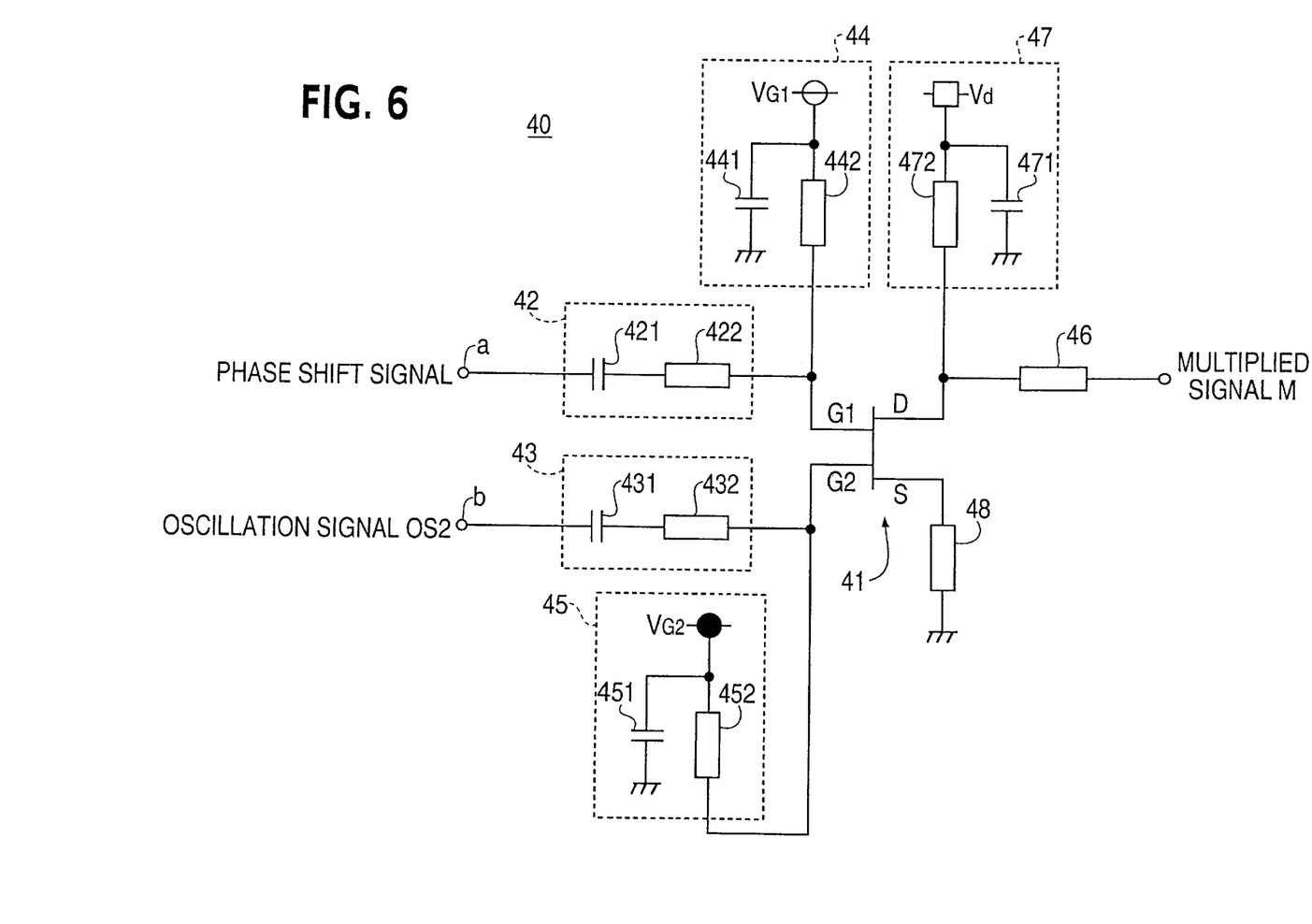
FIG. 6 shows a circuit diagram of the multiplier of the preferred embodiment of the present invention.

The multiplier 40 can be constructed in a variety of ways. As an example of the multiplier 40, a dual gate FET (Field Effect Transistor) multiplier is described below.

FIG. 6 shows a circuit diagram of the multiplier of the preferred embodiment. The dual gate FET multiplier has a dual gate FET 41, a first gate input circuit 42, a second gate input circuit 43, a first gate voltage supply circuit 44, a second gate voltage supply circuit 45, a drain matching circuit 46, a drain voltage supply circuit 47 and a source circuit 48 as shown in FIG. 6.

The first gate input circuit 42 has a capacitor 421 and a gate matching transmission line 422. One terminal of the capacitor 421 is connected to a first input terminal a, and another terminal of the capacitor 421 is connected to the gate matching transmission line 422. The gate matching transmission line 422 connects the capacitor 421 to a first gate G1 of the dual gate FET 41. The second gate input circuit 43 has a capacitor 431 and a gate matching transmission line 432. One terminal of the capacitor 431 is connected to a second input terminal b, and another terminal of the capacitor 431 is connected to the gate matching transmission line 432. The gate matching transmission line 432 connects the capacitor 431 to a second gate G2 of the dual gate FET 41.

The first gate voltage supply circuit 44 has a capacitor 441 and a gate voltage supply line 442. One terminal of the capacitor 441 is connected to a first gate voltage VG1, and another terminal of the capacitor 441 is connected to ground. One terminal of the gate voltage supply line 442 is connected to a first gate voltage VG1, and another terminal of the gate voltage supply line 442 is connected to the first gate G1 of the dual gate FET 41. The second gate voltage supply circuit 45 has a capacitor 451 and a gate voltage supply line 452. One terminal of the capacitor 451 is connected to a second gate voltage VG2, and another terminal of the capacitor 451 is connected to ground. One terminal of the gate voltage supply line 452 is connected to a second gate voltage VG2, and another terminal of the gate voltage supply line 452 is connected to the first gate G2 of the dual gate FET 41.

The drain matching circuit 46 is a drain matching transmission line, which connects a drain D of the dual gate FET 41 to an output terminal c.

The drain voltage supply circuit 47 has a capacitor 471 and a drain voltage supply line 472. One terminal of the capacitor 471 is connected to a drain voltage VD, and another terminal of the capacitor 451 is connected to ground. One terminal of the drain voltage supply line 472 is connected to a drain voltage VD, and another terminal of the gate voltage supply line 472 is connected to the drain of the dual gate FET 41.

The source circuit 48 is a source grounding transmission line, which connects a source S of the dual gate FET 41 to ground.

The phase shift oscillation signal OSP from the phase shifter 30 is applied to the first input terminal a, and the oscillation signal OS2 from the duplicator 2 is applied to the second input terminal b. The first gate voltage VG1 and the second gate voltage VG2 are determined in order to make the dual gate FET 41 operate in a non-linear region. As a result of the oscillation signals, a high frequency current is output from the drain D. However, the output signal from the drain D of the dual gate transistor 41 includes a direct current component or low-frequency component current, which corresponds to the phase difference between the phase shift oscillation signal OSP and the oscillation signal OS2. The output signal from the drain D is supplied as the multiplied signal M.

The dual gate multiplier can perform the calculation there of even if the amplitudes applied to the first and second terminals are not even. That is, even if the amplitude of the oscillation signal OS2 is wider than that of the phase shift oscillation signal OSP (or opposite OS2<OSP), the dual gate multiplier multiplies correctly. Therefore, a circuit for adjusting the amplitude of the inputted signals (for example, the amplifier) can be removed, and the multiplier 40 can be simplified.

As described above, the multiplied signal M is output to the error signal generating circuit 50, the multiplied signal M includes a direct current component or a low-frequency component current, which corresponds to the phase difference between the phase shift oscillation signal OSP and the oscillation signal OS2. The error signal generating circuit 50 selects the direct current component or the low-frequency component current, which correspond to the phase difference between the phase shift oscillation signal OSP and the oscillation signal OS2, and outputs the error signal GV according to the selected signal. The error signal GV of this example is expressed by the following equation:

$$G = -k \cdot d \cdot a1 \cdot a2 \cdot \Delta\omega/2 \quad (d: \text{detecting coefficient})$$

Figure 7:
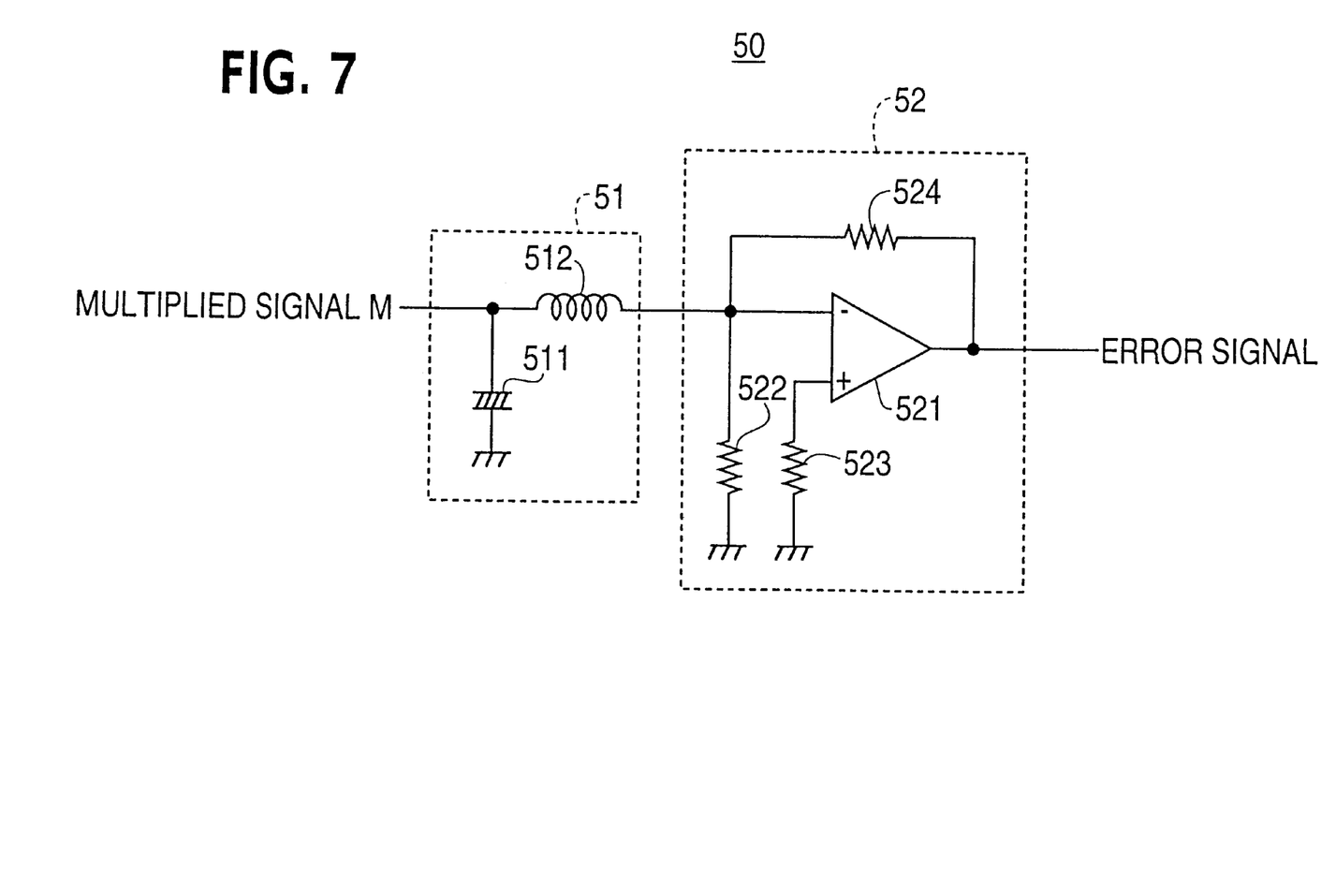
FIG. 7 shows a circuit diagram of the error signal generating circuit 50 of the preferred embodiment of the present invention.

FIG. 7 shows a circuit diagram of the error signal generating circuit 50 of the preferred embodiment. The error signal generating circuit 50 includes a low pass filter 51 and a differential amplifier 52 as shown in FIG. 7.

The low pass filter 51 includes a capacitor 511 and an inductance 512, and selects the direct current component or the low-frequency component current, which corresponds to the phase difference between the phase shift oscillation signal OSP and the oscillation signal OS2, from the multiplied signal M. The direct current component or the low-frequency component current is supplied to the differential amplifier 52.

The differential amplifier 52 includes an operation amplifier 521 and resistors 522~524. The differential amplifier 52 amplifies the direct current component or the low-frequency component current. The output signal from the low pass filter 51 is input to an inverting input terminal. Therefore, the differential amplifier 52 operates as an inverting amplifier, and supplies the amplified signal to the voltage controlled oscillator 1 as the error signal GV.

If the frequency of the oscillation signal OS from the voltage control oscillator 1 is a target frequency ω, then Δω becomes "0". The differential amplifier 52 outputs the error signal GV corresponding to 0V, and therefore the frequency of the oscillation signal OS generated by the voltage control oscillator 1 is not changed.

If the frequency of the oscillation signal OS from the voltage control oscillator 1 is lower than the target frequency ω, then Δω becomes a negative value. The error signal generating circuit 50 outputs the error signal GV of a positive voltage, which is calculated according to above described equation. The voltage control oscillator 1 increases the frequency of the oscillation signal OS according to the error signal of the positive voltage. Therefore, the frequency of the oscillation signal OS is stabilized.

If the frequency of the oscillation signal OS from the voltage control oscillator 1 is higher than the target frequency ω, then Δω becomes a positive value. The error signal generating circuit 50 outputs the error signal GV of a negative voltage, which is calculated according to above equation. The voltage control oscillator 1 decreases the frequency of the oscillation signal OS according to the error signal of the negative voltage. Therefore, the frequency of the oscillation signal OS is stabilized.

As described above, the frequency control oscillator of this embodiment detects the difference in frequency between the oscillation signal OS and the target signal ω by using the dielectric resonator 30. The resonator 30 has a fine quality factor as described above, and the difference in frequency is measured based on the difference in phase. The dielectric resonator 30 is stable against the temperature variations, and requires little space. Therefore, the operation of the frequency control oscillator is improved, and the size of the frequency control oscillator is reduced.

The first and second transmission line 33 and 35 have a micro strip line structure in this embodiment. However, transmission lines of other structures can be applied. Further, the second transmission line 35 is used in the embodiment. However, the second transmission line 35 can be eliminated if the dielectric disc 34 is formed adjacent to the edge of the dielectric substrate 32, and the phase shift signal OSP is output from the edge of the dielectric substrate 32.

The dielectric disc 34 of circular shape is used in the above described embodiment. However, other shape can be applied to the dielectric disc 34.

What is claimed is:

1. A frequency control oscillator comprising:
   an oscillator which generates an oscillation signal having a frequency which is controlled according to an error signal;
   a phase shifter which outputs a phase shift oscillation signal corresponding to a difference between the frequency of the oscillation signal and a target frequency;
   a multiplier which outputs a multiplied signal corresponding to a multiplied value of the phase shift oscillation signal and the oscillation signal; and
   an error signal generator which outputs the error signal according to the multiplied signal.

2. The frequency control oscillator according to claim 1, wherein the phase shifter includes a dielectric disk resonator.

3. The frequency control oscillator according to claim 2, further comprising a duplicator which supplies the oscillation signal to the phase shifter and the multiplier.

4. The frequency control oscillator according to claim 3, wherein the phase shifter further comprises:
   a first transmission line which shifts a phase of the oscillation signal by a fixed amount, and outputs an intermediate phase shift signal,
   the dielectric disk resonator having a resonance frequency corresponding to the target frequency, and shifts a phase of the intermediate phase shift signal according to a difference between the frequency of the oscillation signal and the target frequency.

5. The frequency control oscillator according to claim 2, wherein the phase shifter further comprises:
   a first phase shifter which outputs an intermediate phase shift signal,
   wherein the dielectric disk resonator shifts the intermediate phase shift signal according to a difference between a frequency of the intermediate phase shift signal and the target frequency.

6. The frequency control oscillator according to claim 2, wherein a resonant frequency of the dielectric disk resonator is the target frequency.

7. The frequency control oscillator according to claim 1, where the multiplied signal corresponds to a difference in phase between the phase shift oscillation signal and the oscillation signal.

8. The frequency control oscillator according to claim 1, wherein said multiplier includes a dual gate FET.

9. The frequency control oscillator according to claim 1, wherein said error signal generator comprises:
   a low pass filter which outputs a signal corresponding to one of a direct current component and a low frequency component current of the multiplied signal, and
   a differential amplifier which outputs the error signal according to the signal output by said low pass filter.

10. A frequency control oscillator comprising:
    an oscillator which generates an oscillation signal having a frequency which is controlled according to an error signal;
    a phase shifter which outputs a phase shift oscillation signal corresponding to a difference between the frequency of the oscillation signal and a target frequency;
    a multiplier which outputs a multiplied signal corresponding to a multiplied value of the phase shift oscillation signal and the oscillation signal; and
    an error signal generator which outputs the error signal according to the multiplied signal,
    wherein the phase shifter comprises
       a first phase shifter which outputs an intermediate phase shift signal, and
       a second phase shifter which shifts the intermediate phase shift signal according to a difference between a frequency of the intermediate phase shift signal and the target frequency.

11. The frequency control oscillator according to claim 10, wherein the second phase shifter includes a dielectric resonator.

12. The frequency control oscillator according to claim 11, wherein a resonant frequency of the dielectric resonator is the target frequency.

13. The frequency control oscillator according to claim 10, wherein the first phase shifter includes a transmission line which shifts a phase of the oscillation signal by a fixed amount.

14. The frequency control oscillator according to claim 10, wherein the multiplied signal corresponds to a difference in phase between the phase shift oscillation signal and the oscillation signal.

15. The frequency control oscillator according to claim 10, wherein said multiplier includes a dual gate FET.

16. The frequency control oscillator according to claim 10, wherein said error signal generator comprises:
   a low pass filter which outputs a signal corresponding to one of a direct current component and a low frequency component current of the multiplied signal, and
   a differential amplifier which outputs the error signal according to the signal output by said low pass filter.

17. A frequency control oscillator comprising:
   an oscillator which generates an oscillation signal having a frequency which is controlled according to an error signal;
   a phase shifter which outputs a phase shift oscillation signal corresponding to a difference between the frequency of the oscillation signal and a target frequency;
   a multiplier which outputs a multiplied signal corresponding to a multiplied value of the phase shift oscillation signal and the oscillation signal; and
   an error signal generator which outputs the error signal according to the multiplied signal,
   wherein the phase shifter comprises
      a first transmission line which shifts a phase of the oscillation signal by a fixed amount, and outputs an intermediate phase shift signal, and
      a dielectric disk which has a resonance frequency corresponding to the target frequency, and which shifts a phase of the intermediate phase shift signal according to a difference between the frequency of the oscillation signal and the target frequency.

18. The frequency control oscillator according to claim 17, wherein the multiplied signal corresponds to a difference in phase between the phase shift oscillation signal and the oscillation signal.

19. The frequency control oscillator according to claim 17, wherein said multiplier includes a dual gate FET.

20. The frequency control oscillator according to claim 17, wherein said error signal generator comprises:
   a low pass filter which outputs a signal corresponding to one of a direct current component and a low frequency component current of the multiplied signal, and
   a differential amplifier which outputs the error signal according to the signal output by said low pass filter.

* * * * *